United States Patent
Matsushita

[11] Patent Number: 5,998,808
[45] Date of Patent: Dec. 7, 1999

[54] THREE-DIMENSIONAL INTEGRATED CIRCUIT DEVICE AND ITS MANUFACTURING METHOD

[75] Inventor: Takeshi Matsushita, Kanagawa, Japan

[73] Assignee: Sony Corporation, Tokyo, Japan

[21] Appl. No.: 09/105,016

[22] Filed: Jun. 26, 1998

[30] Foreign Application Priority Data

Jun. 27, 1997 [JP] Japan ..................................... 9-171740

[51] Int. Cl.[6] .................................................. H01L 31/00
[52] U.S. Cl. ........................... 257/74; 257/232; 257/303; 257/306; 257/443; 257/444; 257/350; 257/777
[58] Field of Search .................................. 257/443, 444, 257/777, 306, 350, 351, 303, 232, 233, 74, 3

[56] References Cited

U.S. PATENT DOCUMENTS

| | | | |
|---|---|---|---|
| 4,461,922 | 7/1984 | Gay et al. | 136/249 |
| 4,481,378 | 11/1984 | Lesk | 136/244 |
| 5,398,200 | 3/1995 | Mazuré et al. | 365/174 |
| 5,401,983 | 3/1995 | Jokerst | 257/82 |
| 5,612,552 | 3/1997 | Owens | 257/202 |
| 5,731,621 | 3/1998 | Kosai | 257/440 |
| 5,747,846 | 5/1998 | Iida et al. | 257/314 |
| 5,852,310 | 12/1998 | Kadosh | 257/67 |

*Primary Examiner*—William Mintel
*Attorney, Agent, or Firm*—Hill & Simpson

[57] ABSTRACT

A three-dimensional integrated circuit device incorporating any two-dimensional LSIs, such as CCD, MOS-type imaging device and DRAM using trench-type capacitors as its memory cell, can be manufactured economically. Each two-dimensional LSI is prepared by first forming a single-crystal silicon layer on a single-crystal silicon substrate via a porous silicon layer and thereafter forming the two-dimensional LSI on the single-crystal silicon layer. After a support substrate is bonded to the surface of the two-dimensional LSI, the two-dimensional LSI is detached from the single-crystal silicon substrate along the porous layer, and subsequently stacked on another two-dimensional LSI formed on another single-crystal silicon substrate by bonding the bottom surface of the former to the top surface of the latter. After a desired number of two-dimensional LSIs in form of thin films are stacked, the top surface of a two-dimensional LSI formed on a single-crystal silicon substrate is bonded to the bottom surface of the last stacked two-dimensional LSI to complete a three-dimensional VLSI. The thickness of the single crystal silicon layer is determined depending upon the two-dimensional LSI formed thereon.

5 Claims, 9 Drawing Sheets

THREE-DIMENSIONAL INTEGRATED CIRCUIT DEVICE AND ITS MANUFACTURING METHOD

BACKGROUND OF THE INVENTION

1. Field of the Invention

This invention relates to a three-dimensional integrated circuit device and its manufacturing method.

2. Description of the Related Arts

Research and study on three-dimensional have been directed heretofore to three-dimensionally intergrated circuits (ICS) stacking two-dimensional ICs, aiming for (1) higher integration and higher density by increasing the number of layers, (2) higher speed of operation of devices by decreasing the wiring length and load capacitance, (3) simultaneous transmission of signals through a number of fine through holes (parallel signal processing) and (4) incorporation of different devices (multi-functions). To realize such three-dimensional integrated circuit devices, SOI (Silicon-on-Insulator) technology and multi-layered wiring technology, among others, have been developed to stack two-dimensional ICs in multiple layers. However, the conventional SOI technology relying on re-crystallization, or the like, could not realize practically acceptable three-dimensional integrated circuit devices because layers stacked by the SOI technology progressively deteriorate in crystallographic property, from the first layer to the second layer, toward upper layers. Additionally, since conventional SOI technology configured to stack layers by one layer over another took a lot of time to complete three-dimensional integrated circuit devices, its cost performance was not good.

There is another technology called CUBIC (Cumulatively Bonded IC) technology has been developed to realize three-dimensional integrated circuit devices. The CUBIC technology is a technique for bonding devices particularly characterized in using a thin IC layer as an elementary unit to be bonded. FIGS. 1 through 6 show a method for fabricating a three-dimensional LSI by the conventional CUBIC technology.

As shown in FIG. 1, in this method, one first makes a two-dimensional LSI 102 on a single-crystal silicon substrate 101 by an LSI process. In the two-dimensional LSI 102, numeral 103 denotes a device isolation oxide film, 104 a MOSFET, 105 a polycrystalline silicon wiring, 106 an inter-layer insulation film, 106a a via hole, 107 a surface metal wiring, 108 an inter-layer insulation film, 108a a via hole, and 109 a tungsten bump. Thereafter, an adhesive 110 is applied onto the surface of the inter-layer insulation film 108, and a support substrate 111 is bonded.

After that, as shown in FIG. 2, the single-crystal silicon substrate 101 is polished and thinned from its bottom surface by selective polishing using the device isolation oxide film 103 as an abrasion stopper to form a single-crystal silicon layer 111.

Next, as shown in FIG. 3, a through hole 112 is made in the device isolation oxide film 103 to reach the poly-crystalline silicon wiring 105, and a bottom metal wiring 113 in contact with the polycrystalline silicon wiring 105 through the through hole 112 is formed on the device isolation oxide film 103. Then, a coating of polyimide 114 is applied on the bottom surface of the two-dimensional LSI 102. After a contact hole 114a is made in the polyimide 114, an Au/In pool 115 is formed in the contact hole 114a.

On the other hand, another two-dimensional LSI 117 as shown in FIG. 4 is made on another single-crystal silicon substrate 116 by an LSI process. In the two-dimensional LSI 117, numeral 118 denotes a device isolation oxide film, 119 a MOSFET, 120 a poly-crystalline silicon wiring, 121 an inter-layer insulation film, 121a a via hole, 122 a surface metal wiring, 123 an inter-layer insulation film, 123a a via hole, and 124 a tungsten bump. Thereafter, a coating of polyimide 125 is applied onto the surface of the inter-layer insulation film 123.

Thereafter, as shown in FIG. 5, the bottom surface of the two-dimensional LSI 102 shown in FIG. 3 is bonded to the top surface of the two-dimensional LSI 117 shown in FIG. 4 with polyimide coatings 114, 125 to conjoin them. At that time, both two-dimensional LSIs 102 and 117 are positionally adjusted to bring the tungsten plug 124 into contact with the Au/In pool 115, then heated to a melting temperature of the Au/In pool 115, around 350° C., for example, and pressed. As a result, the tungsten bump 124 and the Au/In pool 115 are electrically connected.

After that, the support substrate 111 is removed by polishing or etching. As a result, as shown in FIG. 6, the intended three-dimensional LSI including two two-dimensional LSIs 102 and 117 is obtained.

As explained above, since the method for fabricating three-dimensional LSI by CUBIC technology forms two-dimensional LSIs on different poly-crystalline silicon substrates in concurrent, parallel progression, and sequentially conjoins these two-dimensional LSIs under a low temperature (approximately 350° C.), three-dimensional LSIs having a multi-layered structure stacking two or more two-dimensional LSIs can be manufactured efficiently.

However, since the conventional manufacturing method using CUBIC technology relies on selective polishing using the device isolation oxide film 103 as the abrasion stopper to thin the single-crystal silicon substrate 101, the thickness of the single-crystal silicon layer 111 obtained by thinning substantially depends on the thickness of the device isolation oxide film 103. However, the device isolation oxide film 103 is typically 1 μm thick maximum, the CUBIC technology cannot be used to fabricate a two-dimensional LSI requiring at least 1 μm thick single-crystal silicon, such as CCD, MOS-type imaging device, or DRAM using trench-type capacitors as its memory cells. Additionally, the CUBIC technology is expensive in terms of the material cost because it needs single-crystal silicon substrates as many as the number of two-dimensional LSIs to be stacked and support substrates as many as the number of layers minus 1, and results in increasing the manufacturing cost of the three-dimensional LSI.

OBJECTS AND SUMMARY OF THE INVENTION

It is therefore an object of the invention to provide a method for economically manufacturing three-dimensional integrated circuit devices including CCDS, MOS-type imaging devices and DRAMs using trench-type capacitors as its memory cells.

Another object of the invention is to provide a three-dimensional integrated circuit device which can contain, in particular, CCD, MOS-type imaging device and DRAM using trench-type capacitors as its memory cells.

According to a first aspect of the invention, there is provided a method for manufacturing a three-dimensional integrated circuit device comprising the steps of:

forming a porous layer on a semiconductor substrate;

forming a single-crystal semiconductor layer on the porous layer having a first layer of integrated circuit;

detaching the first layer of integrated circuit from the semiconductor substrate; and bonding the first layer of integrated circuit to a second layer of integrated circuit formed on another substrate.

In the first aspect of the invention, the porous layer is typically made by anodization. The first layer of integrated circuit may be separated from the semiconductor substrate by first bonding the other substrate (support substrate) onto the surface of the first layer of integrated circuit, then irradiating ultrasonic waves to the semiconductor substrate, and/or generating opposite tensile stress in the semiconductor substrate and the other substrate, and/or cooling the semiconductor substrate and the other substrate. The other substrate may be, for example, a silicon substrate or a quartz substrate.

According to a second aspect of the invention, there is provided a three-dimensional integrated circuit device in which a plurality of layer of integrated circuits are stacked, comprising:

at least one of the layer of integrated circuits but one in the first layer is formed within a single-crystal semiconductor layer having a thickness not less than 1 $\mu$m.

In this invention, the layer of integrated circuit forming the bottom layer, i.e. the first layer, of the three-dimensional integrated circuit device may be made either on a semiconductor substrate or on a single-crystal semiconductor layer stacked on a semiconductor substrate via a porous layer.

Layers of integrated circuits forming the three-dimensional integrated circuit device are designed to have functions and performances required in the three-dimensional integrated circuit device. Examples of layers of integrated circuits a re memory of a DRAM, microprocessor, A/D converter, D/A converter, optical sensor, solar cell, and so forth. The optical sensor may be a CCD, a MOS-type imaging device, or the like.

When one of the layers of integrated circuits is a DRAM using trench-type capacitors as its memory cells, the single-crystal semiconductor layer forming the DRAM may be approximately 3 $\mu$m thick or more. If one of the layers of integrated circuits is a MOS-type imaging device, then the single-crystal semiconductor layer forming the MOS-type imaging device may be approximately 10 $\mu$m thick or more. If one of the layers of integrated circuits is a CCD, then the single-crystal semiconductor layer forming the CCD may be approximately 20 $\mu$m thick or more.

When an image sensor and a signal processing circuit are formed integrally to realize a multi-functional three-dimensional integrated circuit device, an optical sensor such as a CCD or a MOS-type imaging device is used as the top-layer of integrated circuit. When a CCD is used as the optical sensor and coloring is desired, color filters must be made on the CCD. Color filters, in general, are not resistant to heat (about 350° C.) applied during inter-layer wiring by In/Au pools, for example. Therefore, after all of the layers of integrated circuits are bonded together, the other substrate temporarily used as the support substrate is removed to expose the surface of the CCD, and color filters are formed thereon. Alternatively, a solar cell may be used as the top-layer of an integrated circuit to generate electrical energy.

Layers of integrated circuits may include a wiring layer having only a wiring layout. Such a wiring layer can minimize the length of wiring between devices and can increase the operation speed of the three-dimensional integrated circuit device.

Typical single-crystal semiconductor layers forming these layer of integrated circuits are single-crystal silicon layers. However, there may be other single-crystal compound semiconductor layers such as gallium arsenide (GaAs), or the like. Similarly, usable as the semiconductor substrate is a silicon substrate or any compound semiconductor substrate such as gallium phosphide (GaP), gallium arsenide (GaAs), or the like.

The method for manufacturing a three-dimensional integrated circuit device according to the first aspect of the invention summarized above can make individual layers of integrated circuits in a short time by first making each layer of integrated circuit in a single-crystal semiconductor layer stacked on a semiconductor substrate via a porous layer and thereafter separating it from the semiconductor substrate along the porous layer to obtain the layer of integrated circuit in form of a thin film. By next stacking these layer of integrated circuits, a three-dimensional integrated circuit device can be made in a short time. Additionally, by stacking the single-crystal semiconductor layer as thick as 1 $\mu$m minimum, CCD, MOS-type imaging device or DRAM using trench-type capacitors as its memory cells can be made. Moreover, the method can use semiconductor substrates again and again for making these layer of integrated circuits, and can therefore decrease the manufacturing cost of the three-dimensional integrated circuit device.

According to the construction of the three-dimensional integrated circuit device summarized above as the second aspect of the invention, at least one of layer of integrated circuits in the second and subsequent layers is formed in a single-crystal semiconductor layer as thick as 1 $\mu$m or more. Therefore, CCD, MOS-type imaging device or DRAM using trench-type capacitors can be made as a layer of integrated circuit on the single-crystal semiconductor layer.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Figure 1:
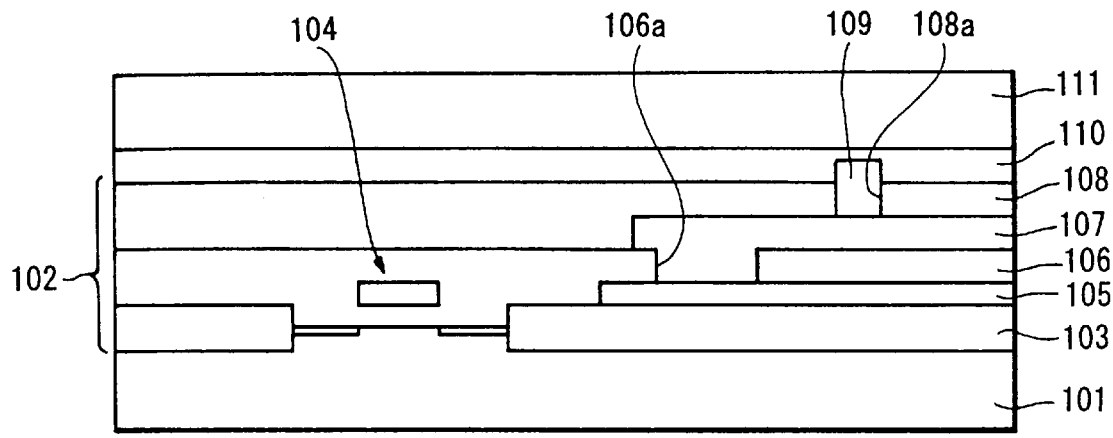
FIG. 1 is a cross-sectional view for explaining a conventional method for manufacturing a three-dimensional IC by CUBIC technology.
Figure 2:
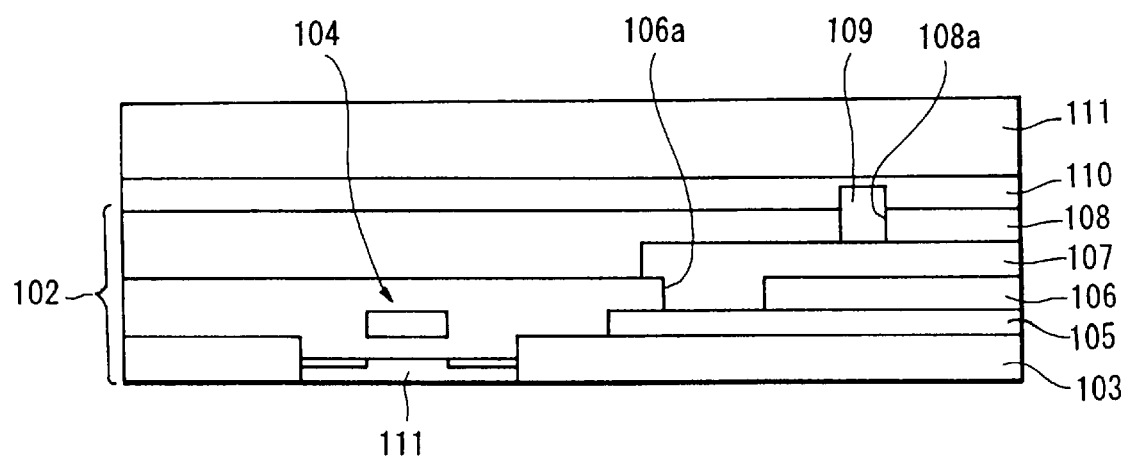
FIG. 2 is a cross-sectional view for explaining the conventional method for manufacturing a three-dimensional IC by CUBIC technology.
Figure 3:
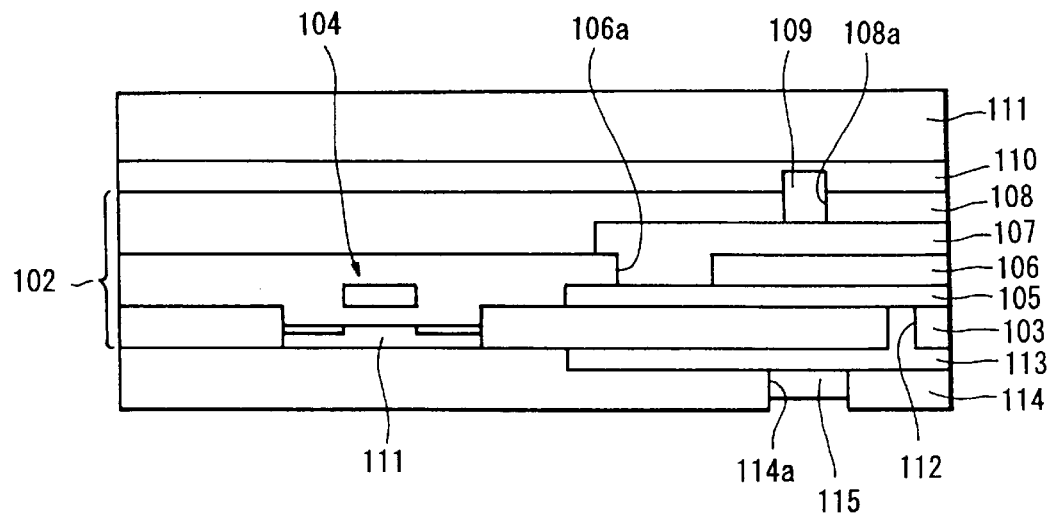
FIG. 3 is a cross-sectional view for explaining the conventional method for manufacturing a three-dimensional IC by CUBIC technology.
Figure 4:
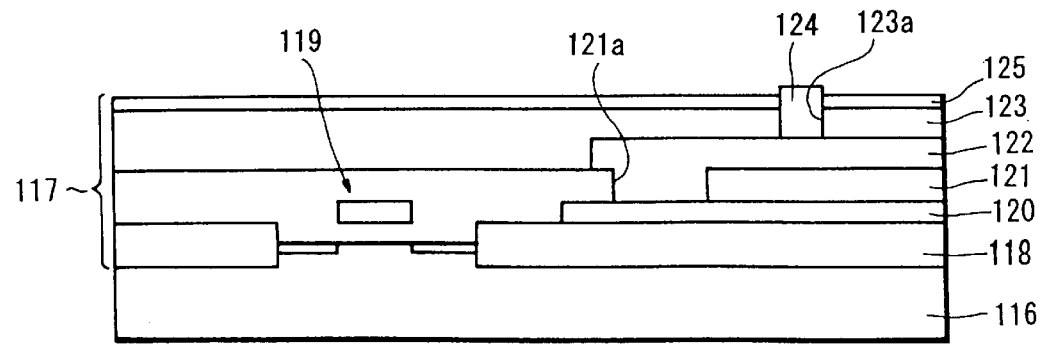
FIG. 4 is a cross-sectional view for explaining the conventional method for manufacturing a three-dimensional IC by CUBIC technology.
Figure 5:
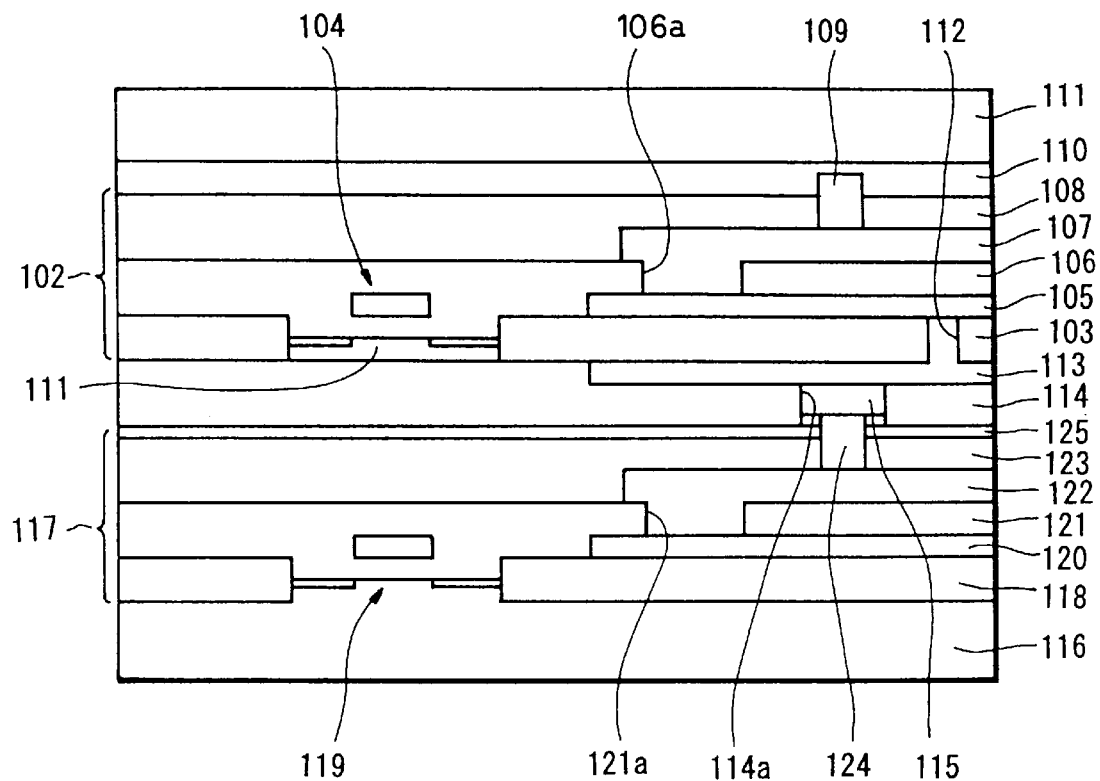
FIG. 5 is a cross-sectional view for explaining the conventional method for manufacturing a three-dimensional IC by CUBIC technology.
Figure 6:
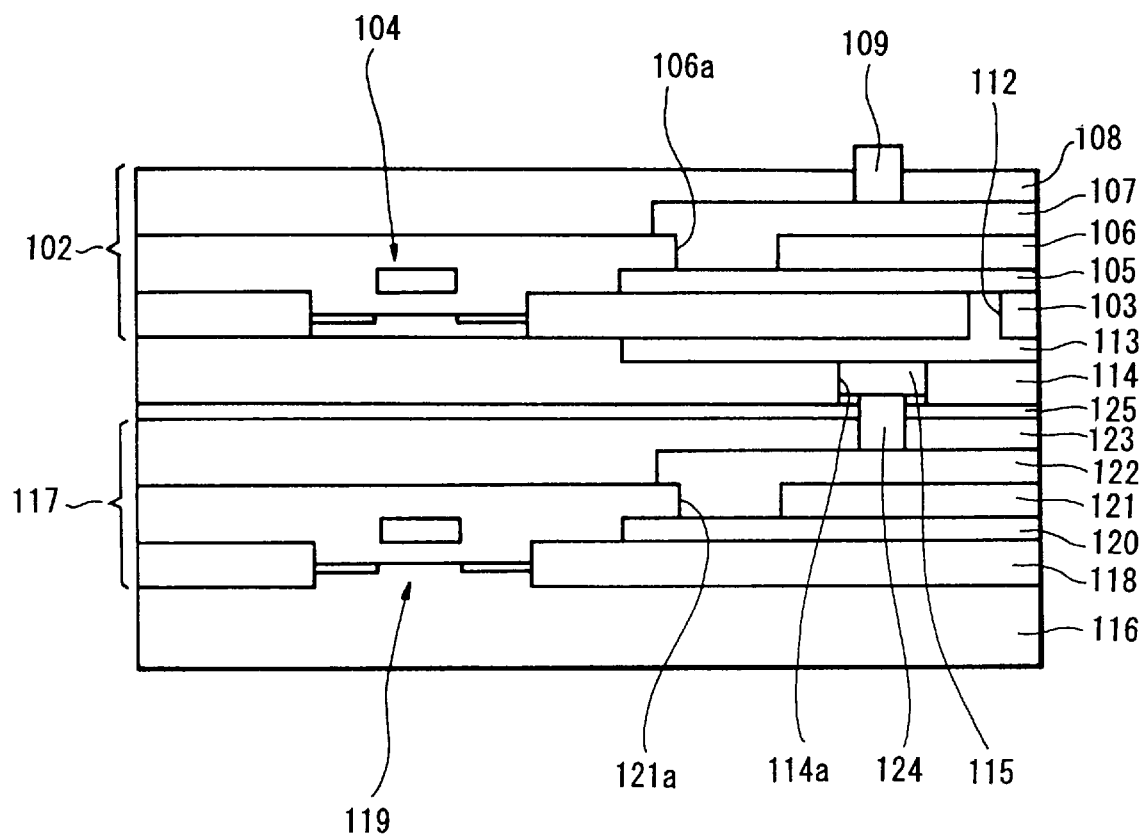
FIG. 6 is a cross-sectional view for explaining the conventional method for manufacturing a three-dimensional IC by CUBIC technology.

Explained below is an embodiment of the invention with reference to the drawings. In all figures illustrating the embodiments of the invention, the same or equivalent elements are labeled with common reference numerals.

FIGS. 7 through 16 illustrate a method for manufacturing three-dimensional VLSI according to an embodiment of the invention.

Figure 7:
FIG. 7 is a cross-sectional view for explaining a method for manufacturing three-dimensional VLSI according to an embodiment of the invention.

First referring to FIG. 7, the process according to the embodiment starts with preparing a single-crystal silicon substrate 1. For the benefit of a porous silicon layer made later by anodization, the single-crystal silicon substrate 1 is preferably of a p-type. However, even if it is of an n-type, the porous silicon layer can be made under specific conditions. The single-crystal silicon substrate 1 has a resistivity preferably in the range of 0.01 to 0.02 Ω·cm.

Figure 8:
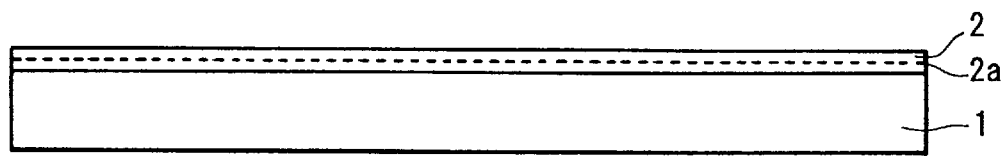
FIG. 8 is a cross-sectional view for explaining the method for manufacturing three-dimensional VLSI according to an embodiment of the invention.

As shown in FIG. 8, a porous silicon layer 2 is made on the surface of the single-crystal silicon substrate 1 by anodization. In this case, the porous silicon layer is made in three divisional steps. In the first step, a porous silicon layer with a low porosity is made by anodization under a current density of approximately 0.5 to 3 mA/cm$^2$, for example, for 8 minutes, for example, to ensure an epitaxial layer with a good crystallographic property to be made on the porous silicon layer 2. In the second step, a porous silicon layer with a moderate porosity is made by anodization under a current density of 3 to 20 mA/cm$^2$, for example, for eight minutes, for example. In the third step, a porous silicon layer with a high porosity is made by anodization under a current density of 40 to 300 mA/cm$^2$, for example, for several seconds, for example. By anodization in the third step, a thin porous silicon layer 2a with a very high porosity as the origin of a separation layer is made in the porous silicon layer 2. When anodization in the third step is done for three seconds, it may be executed, applying the current one second, then stopping the process, again applying the current of the same current density for another second after a certain period of time, again stopping anodization for a while, and again applying the current of the same current density another second. In the process of anodization, HF:C$_2$H$_5$OH=1:1, for example, is used as the anodization solution. From the view point of repetitive use of the single-crystal silicon substrate 1, the porous silicon layer 2 is preferably as thin as possible to minimize the reduction in thickness of the single-crystal silicon substrate 1 and to thereby maximize its lifetime. Preferably, the thickness is 2 to 15 μm, and more preferably about 8 μm.

Figure 9:
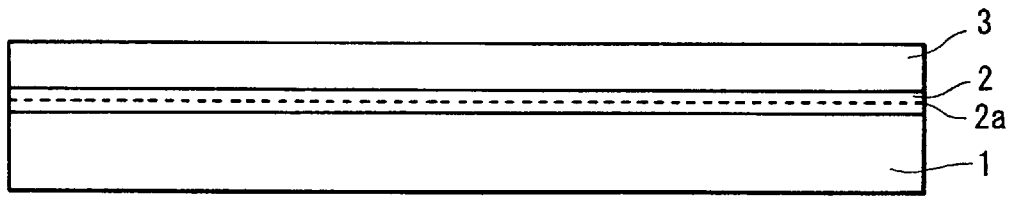
FIG. 9 is a cross-sectional view for explaining the method for manufacturing three-dimensional VLSI according to an embodiment of the invention.

The structure is next treated by hydrogen annealing at 1100° C. for 30 minutes, for example, to close pores (not shown) appearing on the surface of the porous silicon layer 2. After that, as shown in FIG. 9, a p-type or n-type single-crystal silicon layer 3 is epitaxially grown on the porous silicon layer 2 by CVD using SiH$_4$ or SiCl$_4$, for example, as a source material gas at 1070° C., for example. The thickness of the single-crystal silicon layer 3 is determined, preferably in the range of 1 to 30 μm, depending upon a two-dimensional LSI formed thereon. The impurity concentration of the single-crystal silicon layer 3 is preferably in the range of 10$^{14}$/cm$^3$ through 10$^{17}$/cm$^3$, approximately. The impurity concentration of the single-crystal silicon layer 3 may be varied within the layer, if so desired, to improve the performance of the device.

During the process of the hydrogen annealing and epitaxial growth, silicon atoms in the porous silicon layer 2 move and re-align. As a result, the porous silicon layer 2a with a high porosity in the porous silicon layer 2 is changed into a layer with a very low tensile strength, i.e., the separation layer.

Figure 10:
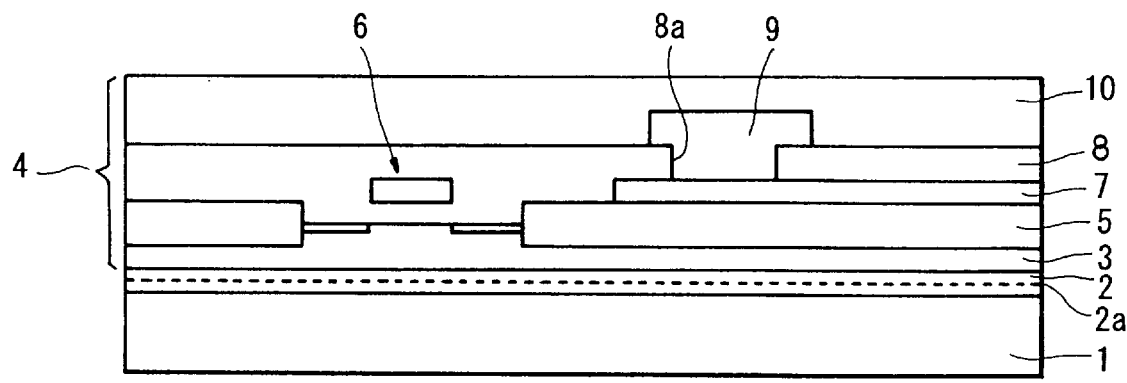
FIG. 10 is a cross-sectional view for explaining the method for manufacturing three-dimensional VLSI according to an embodiment of the invention.

After that, as shown in FIG. 10, regarding the single-crystal silicon layer 3 as a substrate of LSI, the first layer two-dimensional LSI 4 is made by LSI process. In the two dimensional LSI 4, numeral 5 denotes a device isolation oxide film, 6 a MOSFET, 7 a polycrystalline silicon wiring, 8 an inter-layer insulation film, 8a a via hole, 9 a surface metal wiring, and 10 an inter-layer insulation film.

Figure 11:
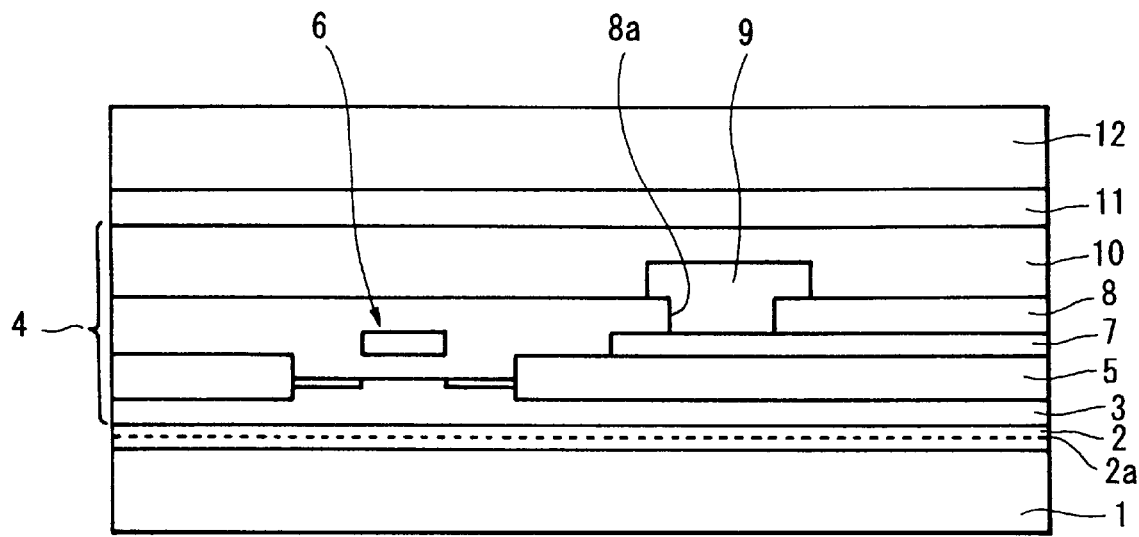
FIG. 11 is a cross-sectional view for explaining the method for manufacturing three-dimensional VLSI according to an embodiment of the invention.

Next referring to FIG. 11, a coating of polyimide 11 is applied onto the surface of the two-dimensional LSI 4, and a support substrate 12, such as silicon substrate, is bonded.

Figure 12:
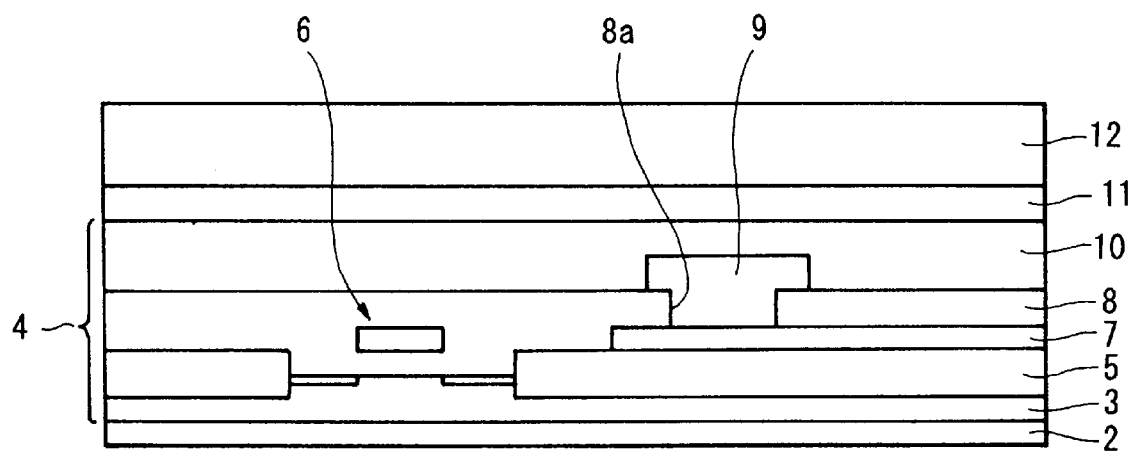
FIG. 12 is a cross-sectional view for explaining the method for manufacturing three-dimensional VLSI according to an embodiment of the invention.

Thereafter, as shown in FIG. 12, the two-dimensional LSI 4 is separated from the single-crystal silicon substrate 1. More specifically, an ultrasonic wave of 25 kHz, frequency, and 600 W, electric power, for example, is irradiated to the single-crystal silicon substrate 1 immersed in water or ethanol solution, for example, to weaken the strength of the porous silicon layer 2a as the separation layer with the energy of the ultrasonic wave until the single-crystal silicon substrate separates along the porous silicon layer 2a. Alternatively, opposite tensile stress is produced in the support substrate 12 and the single-crystal silicon substrate 1 to separate the single-crystal silicon substrate 1 along the porous silicon layer 2a as the separation layer. Alternatively, cold nitrogen gas vaporized from liquid nitrogen, for example, is blown onto the single-crystal silicon substrate 1 and the support substrate 12 to produce deviation stress by a difference in thermal contraction between the single-crystal silicon substrate and the support substrate while they cool down until the single-crystal silicon substrate 1 separates along the porous silicon layer 2a as the separation layer. Alternatively, two or all of these three techniques may be combined to separate the single-crystal silicon substrate along the porous silicon layer 2a as the separation layer.

Figure 13:
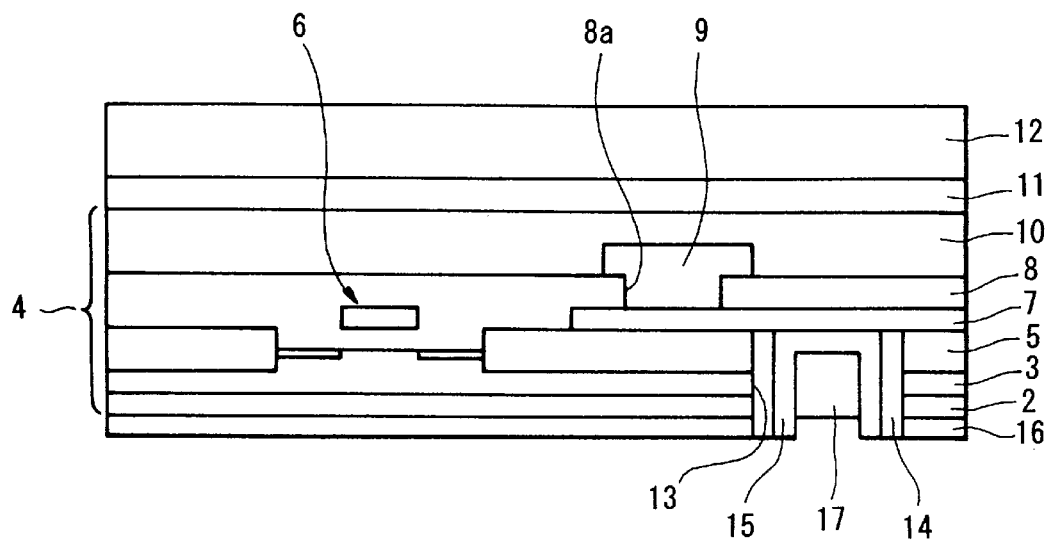
FIG. 13 is a cross-sectional view for explaining the method for manufacturing three-dimensional VLSI according to an embodiment of the invention.

After that, as shown in FIG. 13, taking the separated two-dimensional LSI 4, a through hole 13 is formed from its bottom surface on the single-crystal silicon layer 3 and the device isolation oxide film 5 to reach the polycrystalline silicon wiring 7. Then, an oxide film 14 is formed in the through hole 13, and selectively removed by etching to again expose the polycrystalline silicon wiring 7. Then, a bottom metal wiring 15 in contact with the polycrystalline silicon wiring 7 is formed, and a coating of polyimide 16 is applied thereon. Thereafter, the Au/In plug 17 is made in the recess of the bottom metal wiring 15 within the through hole 13.

Figure 14:
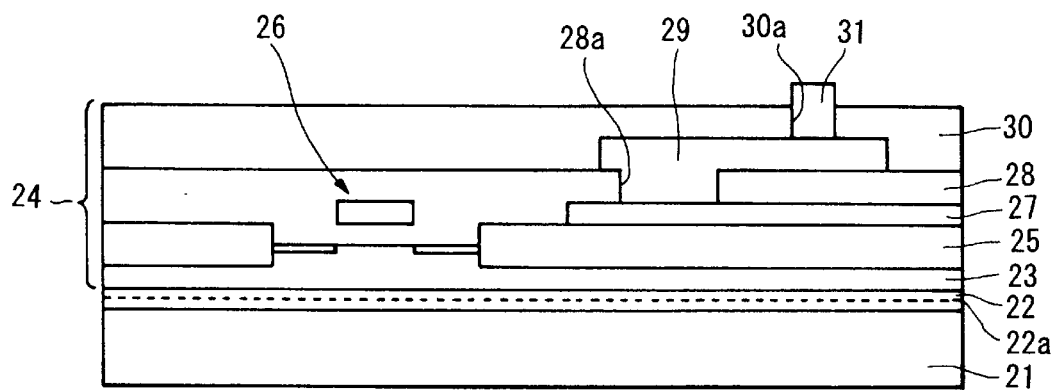
FIG. 14 is a cross-sectional view for explaining the method for manufacturing three-dimensional VLSI according to an embodiment of the invention.

On the other hand, as shown in FIG. 14, a porous silicon layer 22 and a single-crystal silicon layer 23 are formed on another single-crystal silicon substrate 21, and another two-dimensional LSI 24 is made on the single crystal silicon layer 23 in substantially the same process as explained before. The two-dimensional LSI 24 includes a device isolation oxide film 25, MOSFET 26, polycrystalline silicon wiring 27, inter-layer insulation film 28 having via hole 28a, surface metal wiring 29, inter-layer insulation film 30 having a via hole 30a, and tungsten plug 31.

Figure 15:
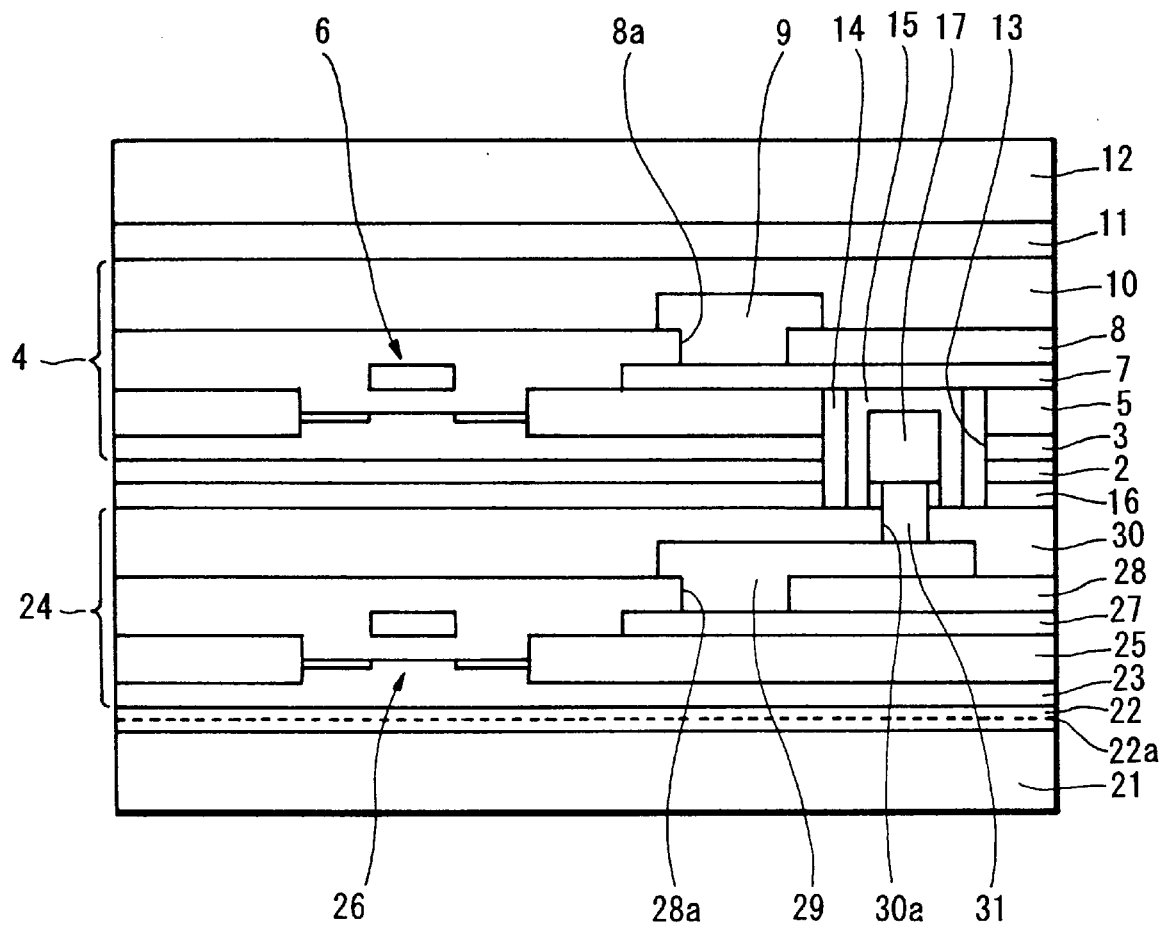
FIG. 15 is a cross-sectional view for explaining the method for manufacturing three-dimensional VLSI according to an embodiment of the invention.

Then, as shown in FIG. 15, the bottom surface of the two-dimensional LSI 4 shown in FIG. 13 is bonded with polyimide 16 to the top surface of the two-dimensional LSI 24 shown in FIG. 14.

Then, using one or more of the above-explained techniques, the unitary body of the two-dimensional LSIs 4 and 24 is detached from the single-crystal silicon substrate 21.

After that, a through hole 32 is formed from the bottom surface of the two-dimensional LSI 24 to extend through the single-crystal silicon layer 23 and the device isolation oxide film 25 and to reach the polycrystalline silicon wiring 27. Then, an oxide film 33 is formed in the through hole 32 and selectively removed by etching to again expose the polycrystalline silicon wiring 27. Thereafter, a bottom metal wiring 34 in contact with the polycrystalline silicon wiring 27 is formed, and a coating of polyimide 35 is applied thereon. Then, the Au/In plug 36 is formed in the recess in the bottom metal wiring 34 within the through hole 32.

Figure 16:
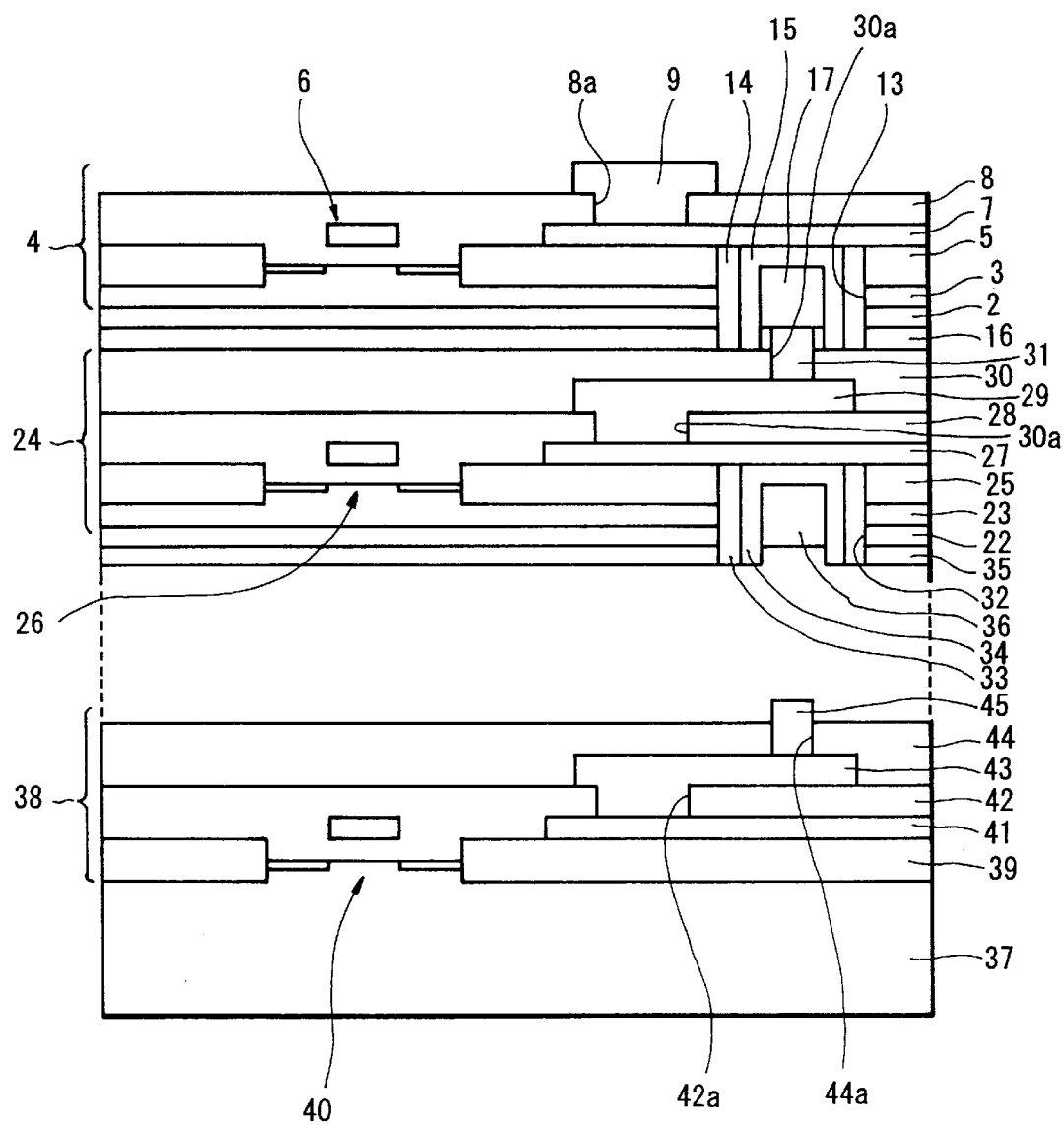
FIG. 16 is a cross-sectional view for explaining the method for manufacturing three-dimensional VLSI according to an embodiment of the invention.

After a desired number of two-dimensional LSIs in form of thin films made on single-crystal silicon layers are bonded sequentially, the top surface of a two-dimensional LSI 38 formed on a single-crystal silicon substrate 37 is bonded to the bottom surface of the last bonded two-dimensional LSI as shown in FIG. 16. In the two-dimensional LSI 38, numeral 39 denotes a device isolation oxide film, 40 a MOSFET, 41 a polycrystalline silicon wiring, 42 an inter-layer insulation film, 42a a via hole, 43 a surface metal wiring, 44 an inter-layer insulation film, 44a a via hole, and 45 a tungsten lug. After that, the support substrate 11 is removed by abrasion or etching to complete the intended three-dimensional VLSI.

According to the embodiment explained above, each two-dimensional LSI in form of a thin film can be made easily in a short time by first forming the single-crystal silicon layer 3 on the single-crystal silicon substrate 1 via the porous silicon layer 2, then making the two-dimensional LSI on the single-crystal silicon layer 3, and thereafter detaching it from the single-crystal silicon substrate 1 along the porous silicon layer 2. Additionally, a three-dimensional VLSI containing any number of two-dimensional LSIs can be made in a short time by bonding a desired number of two-dimensional LSIs in form of thin films and finally bonding them onto the two-dimensional LSI 38 formed on the single-crystal silicon substrate 37.

The single-crystal silicon substrate 1 can be revived into the original form shown in FIG. 7 by removing the porous silicon layer 2 from its top surface, and can therefore be used again in the process shown in FIG. 8. That is, since the single-crystal silicon substrate 1 can be used again and again, and so much decreases the manufacturing cost of devices, in particular, thin-film single-crystal silicon solar cells. More specifically, if the porous silicon layer 2 is 8 $\mu$m thick and abrasion of the single-crystal silicon substrate 1 removes about 3 $\mu$m of its thickness for the next use thereof, then the reduction in thickness of the single-crystal silicon substrate 1 in one cycle of the manufacturing process of the device is 11 $\mu$m. Therefore, even after the single-crystal silicon substrate 1 is used ten times, reduction in thickness thereof is only 110 $\mu$m. Usually, therefore, the single-crystal silicon substrate 1 can be used at least ten times. The porous silicon layer 2 formed on the top surface of the single-crystal silicon substrate 1 can be removed by etching or electrolytic polishing. In an example of removal the porous silicon layer 2 by electrolytic polishing, appropriate current density is about 400 mA/cm$^2$ when the electrolytic polishing solution has a high HF concentration, such as HF:$C_2H_5$OH=1:1.

By using the process explained above, a high-performance three-dimensional VLSI realizing high integration, high density, high-speed operation, parallel signal processing and multi-functions can be manufactured at a low cost.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

For example, in the particular embodiment explained above, the two-dimensional LSI 33 in the lowest layer, i.e. in the first layer, is formed on the single-crystal silicon substrate 32. However, it may be formed as a thin film on a single-crystal silicon layer like the other two-dimensional LSIs in the second and subsequent layers.

As described above, since the method for manufacturing a three-dimensional integrated circuit device according to the invention uses a single-crystal semiconductor layer as thick as 1 $\mu$m or more, it makes it possible to form on the single-crystal semiconductor layer any device such as CCD, MOS-type imaging device or DRAM using trench-type capacitors as its memory cells, to make individual two-dimensional devices in a short time, and to re-use the single-crystal substrate required to form a layer of integrated circuit thereon. Therefore, a three-dimensional integrated circuit device containing CCD, MOS-type imaging device, DRAM using trench-type capacitors as its memory cells, and other like devices can be manufactured at a low cost.

Additionally, according to the three-dimensional integrated circuit device in the present invention, since at least one of the layer of integrated circuit but one in the first layer is formed on a single-crystal semiconductor layer having a thickness not less than 1 $\mu$m, a three-dimensional integrated circuit device containing CCD, MOS-type imaging device, DRAM using trench-type capacitors as its memory cells, and other like devices can be realized.

What is claimed is:

1. A three-dimensional integrated circuit device in which a plurality of layers of integrated circuits are stacked on a substrate in which at least one of said layers of integrated circuits other than a first bottom layer adjacent said substrate is formed within a single-crystal semiconductor layer having a thickness of not less than 1 $\mu$m and is secured to an underlying layer.

2. The three-dimensional integrated circuit device according to claim 1 wherein a first bottom layer of integrated circuits is formed on a semiconductor substrate.

3. The three-dimensional integrated circuit device according to claim 1 wherein a top layer of integrated circuits includes an optical sensor formed therein.

4. The three-dimensional integrated circuit device according to claim 1 wherein a top layer of integrated circuits includes a solar cell.

5. The three-dimensional integrated circuit device according to claim 1 wherein at least one of said layers of integrated circuits is a wiring layer.

* * * * *